United States Patent

Lee

[19]

[11] Patent Number: 6,047,660
[45] Date of Patent: Apr. 11, 2000

[54] APPARATUS AND METHOD TO FORM COATED SHIELDING LAYER FOR COAXIAL SIGNAL TRANSMISSION CABLES

[76] Inventor: Brent W. Lee, 254 Kinney Dr., San Jose, Calif. 95112

[21] Appl. No.: 08/927,553

[22] Filed: Sep. 6, 1997

[51] Int. Cl.$^7$ .................................................. C23C 16/00
[52] U.S. Cl. .................................. 118/723 VE; 118/715
[58] Field of Search .................................. 118/715, 724, 118/728, 723 EB, 723 VE

[56] References Cited

U.S. PATENT DOCUMENTS 5,258,074  11/1993  Okuda et al. ............................ 118/715

OTHER PUBLICATIONS

Derwent Abstract 1976–40721X, Apr. 1976.

*Primary Examiner*—Scott Kastler
*Attorney, Agent, or Firm*—Bo-In Lin

[57] ABSTRACT

The present invention discloses a physical vapor deposition apparatus includes a cable driving and cooling mechanism for driving a cable there-through and for depositing a thin layer of evaporated conductive film on the cable. The thin layer conductive layer can therefore function as a shield to prevent electromagnetic interference (EMI) during high frequency signal transmission. In a preferred embodiment, the apparatus for forming shielding layer for a cable includes two separate chambers. The first chamber is an electric arc chamber for generating metallic vapor by the use of electric arcs. A second chamber is an electron beam chamber. Electron beam generated from an electron gun is irradiated upon an aluminum wire to evaporate the aluminum wire and to deposit the aluminum vapor on the surface of the cable. Both of these chambers are provided with wheels which are employed to direct and pull the cables through the chambers. The wheel is built on a cooling tubes where the cable is cooled through contact with the surface of the wheel with cooling tube formed underneath. Damages from high temperature in these vacuum chambers are prevented with the driving and cooling wheel system.

10 Claims, 3 Drawing Sheets

APPARATUS AND METHOD TO FORM COATED SHIELDING LAYER FOR COAXIAL SIGNAL TRANSMISSION CABLES

BACKGROUND OF THE INVENTION

1. Field of the Invention

This invention relates generally to the apparatus and method to form conductive coatings over cables for shielding. More particularly, this invention relates to new apparatus and method for form a thin conductive layer over the surface of a signal transmission cable with uniform and precisely controlled configuration for shielding the cable from electromagnetic interference (EMI) such that high performance cables for high frequency signal transmission may be provided and the cables can be manufactured in a continuous process to achieve a low production cost

2. Description of the Prior Art

Current technology of cable manufacture and the layer structures of cables produced from applying the state of the art manufacture processes impose an intrinsic limitation to the usefulness of coaxial cable for transmitting signals with bandwidth at higher frequency. Specifically, this limitation is caused by the use of a thin conductive foil, e.g., an aluminum foil over a polyester or mylar backing, as a shielding layer in current technology for cable manufacture. For broadband signal transmission, system engineers are confronted with problems of signal egress and ingress caused by electromagnetic interference (EMI). In order to minimize the EMI effect, a critical design consideration for coaxial cable manufacture is to provide effective cable shielding. A layer of aluminum foil covering a coaxial cable is commonly employed as the shielding layer. The foils is often glued on to prevent movement in broad-band transmission cables. As the cable is bent or twisted, the foils which is glued on are often peeled off or cracked when subject to shear and stress forces. The protection provided by these conductive foils against EMI interference is weakened. As a result, current technology for cable manufacture, particularly the processes employed to produce the shielding layer for the coaxial cables, cannot satisfy the quality requirement necessary for carrying out high level of performance for broadband high frequency signal transmissions. For this reason, optical fibers are commonly employed to replace the coaxial cables for broadband high frequency signal transmissions due to the difficulties in cable manufacture technology that a high quality shielding layer for the coaxial cables suitable for broadband transmission cannot be effectively produced.

A key parameter used to measure the quality of cable for signal transmission is commonly known as structural return loss (SRL). This SRL generally represents the reflection and attenuation of signal transmission due to imperfections of a cable constructions such as imperfections in uniformity, layer structure and shielding configuration of the coaxial cable. A major difficulty confronted by those involved in cable manufacture is the signal loss, i.e., the SRL, caused by a poor quality of the shielding layer due to current limitations in cable manufacture technology. Specifically, current technology, by employing a wrapping foil structure, still has great deal of difficulties to produce a high quality uniform shielding layer. Referring to FIGS. 1A to 1B for the layer structure of a conventional coaxial cable 10. The coaxial cable 10 includes a conductor wire 15 composed of cooper or steel covered by cooper. A multiple layer structure wraps around the conductor wire 15 which includes a dielectric layer 20 composed of dielectric materials such as foam polyethylene. A shielding layer 25 which includes laminated tape of foil/film bonded to the dielectric layer 20 with a layer of adhesive. A metal braid layer 30 covered by an outer cable jacket 40 are formed to provide protection and overall cable tensile strength. For broadband transmission starting about 50 MHz, virtually all the shielding effectiveness is provided by the foil shield 25. However, the seam of the foil is a source of EMI leakage due to manufacture defects or foil damages caused by cable bending or twisting. The braid layer 30 is simply to provide to the connectors, normally crimped on devices, a holding on structure. FIG. 1B shows a wrapping around configuration of the shielding layer 25 consisting of the foil/film layer structure. In order to assure complete coverage of the entire surface for maximum shielding protection, the conductive foil, e.g., aluminum foil, is bonded to the film to prevent foil push back. A shorting fold configuration is employed where the shielding layer is arranged to have an overlapping bottom layer and a top layer. For the purpose of 100% coverage, the bottom layer is bend backward with the aluminum foil facing upward. The top layer then overlaps the bottom layer with the aluminum foil facing down to contact the aluminum layer of the bottom layer to form a shorting fold.

The shorting fold configuration as that shown in FIG. 1B is then wrapped around under a braid layer which is protected by an outer jacket to assure total shield and protection and the layer structure as shown has been commonly employed in the industry for coaxial cables. Such shielding configuration however generates several difficulties for applying coaxial cables for high frequency signal transmission. As discussed above, since this shielding layer is becoming critically important for high frequency signal transmission, the layer uniformity and configuration must satisfy high precision requirements. However, the structure of the shielding layer is intrinsically non-uniform. Also, the shape and exact configuration of the shielding layer 25 are difficult to control during the manufacture process. The mechanical manufacture processes of wrapping around thin foils may often cause uneven shapes and twisted foil structure thus leads to increased amount of layer imperfections and more SRL loss for signal transmission. The overlapping "shorting fold" configuration is not suitable for high frequency transmission due to the overlapping and sharp angle foil interface under the overlapping portion of the foils. Again, when the cable is bent or twisted, foil deformation or damages may become a critical problem. Abnormal signal interference and attenuation in these folding portion or the damaged segments, e.g., a cracked or peel off segments, of the shielding layer are likely to reduce the performance and effectiveness of signal transmission in this types of cables. For these reasons, optical fibers are generally selected for signal transmission when the signal frequency is above certain level.

Therefore, a need still exists in the art of surface coating to provide new apparatuses and methods with new technique, layer structure and materials for providing a shielding layer for the coaxial cables to overcome these limitations and difficulties. It is required that the structural integrity of the dielectric layer for supporting the shielding layer thereon must be maintained without being adversely affected by the method applied to form shielding layer. It is further desirable that the new techniques can provide uniform shielding structure with flexibility to endure cable bending and twisting. Additionally, it is desirable that the manufacture processes can be precisely controllable by applying automated manufacture processes such that high quality coaxial cables suitable for high frequency signal transmission can be mass produced at low costs.

SUMMARY OF THE PRESENT INVENTION

It is therefore an object of the present invention to provide a novel apparatus and method for forming a uniform and reliable shielding layer for the cables to provide high quality signal transmission for high frequency signal such that aforementioned difficulties and limitations encountered by the prior art can be resolved.

Specifically, it is an object of the present invention to provide a novel physical vapor deposition apparatus in a vacuum chamber provided with cable driving and cooling mechanism such that a cable can be processed therein to have a shielding layer with precisely controlled thickness and layer configuration deposited thereon by employing a physical vapor deposition process.

Another object of the present invention is to provide a novel single layer seamless conductive layer to function as a shielding layer for a signal transmission cable to prevent the electromagnetic interference (EMI) wherein the seamless shielding layer with highly uniform structure to function as an outer skin of the dielectric layer which is produced with precisely controlled thickness suitable for high frequency signal transmission.

Another object of the present invention is to provide a novel dual PVD chambers apparatus, includes an electric arc chamber and an electron beam chamber, for evaporating and depositing a thin layer of evaporated metallic particles on the surface of a cable to form a highly uniformly structured, seamless shielding layer for protecting the cable from electromagnetic interference during high frequency signal transmission.

Another object of the present invention is to provide a novel dual PVD chambers apparatus, includes an electric arc chamber and an electron beam chamber, for evaporating and depositing a thin layer of evaporated metallic particles on the surface of a cable to form a highly uniformly structured, seamless shielding layer for protecting the cable from electromagnetic interference such that cost savings are achieved by eliminating the requirement of a braid and coupling connectors for connecting two segments of cables can be more conveniently structured.

Another object of the present invention is to provide a novel dual PVD chambers apparatus, includes an electric arc chamber and an electron beam chamber, for evaporating and depositing a thin layer of evaporated metallic particles on the surface of a cable to form a highly uniformly structured, seamless shielding layer for protecting the cable from electromagnetic interference such that different types of conductive films, other than the conventional aluminum foils, can be employed as EMI shielding materials.

Another object of the present invention is to provide a novel physical vapor deposition apparatus and method of manufacturing to form a shielding layer for signal transmission cable by employing an automated continuous cable feeding and high speed processing method such that the cable can be mass produced without mechanical wrapping processes whereby the signal transmission cables can be provided at a lower production cost.

Another object of the present invention is to provide a novel physical vapor deposition apparatus and method of manufacturing to form a shielding layer for signal transmission cable by employing an automated continuous cable feeding and high speed processing method wherein all the manufacture parameters can be controlled with high precision such that high quality cable can be produced in a well controlled and reliable manner whereby coaxial cables can be employed as an alternate cable for high frequency signal transmission cables without being limited to application of optical fibers.

Briefly, in a preferred embodiment, the present invention discloses a physical vapor deposition apparatus includes a cable driving and cooling mechanism for driving a cable there-through and for depositing a thin layer of evaporated conductive film on the cable. The thin layer conductive layer can therefore function as a shield to prevent electromagnetic interference (EMI) during high frequency signal transmission. In a preferred embodiment, the apparatus for forming shielding layer for a cable includes two separate chambers. The first chamber is an electric arc chamber for generating metallic vapor by the use of electric arcs. A second chamber is an electron beam chamber. Electron beam generated from an electron gun is irradiated upon an aluminum wire to evaporate the aluminum wire and to deposit the aluminum vapor on the surface of the cable. Both of these chambers are provided with wheels which are employed to direct and pull the cables through the chambers. The wheel is built on a cooling tubes where the cable is cooled through contact with the surface of the wheel with cooling channel formed underneath. Potential damages from cable overheat in these vacuum chambers are prevented with the driving and cooling wheel system.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 2:
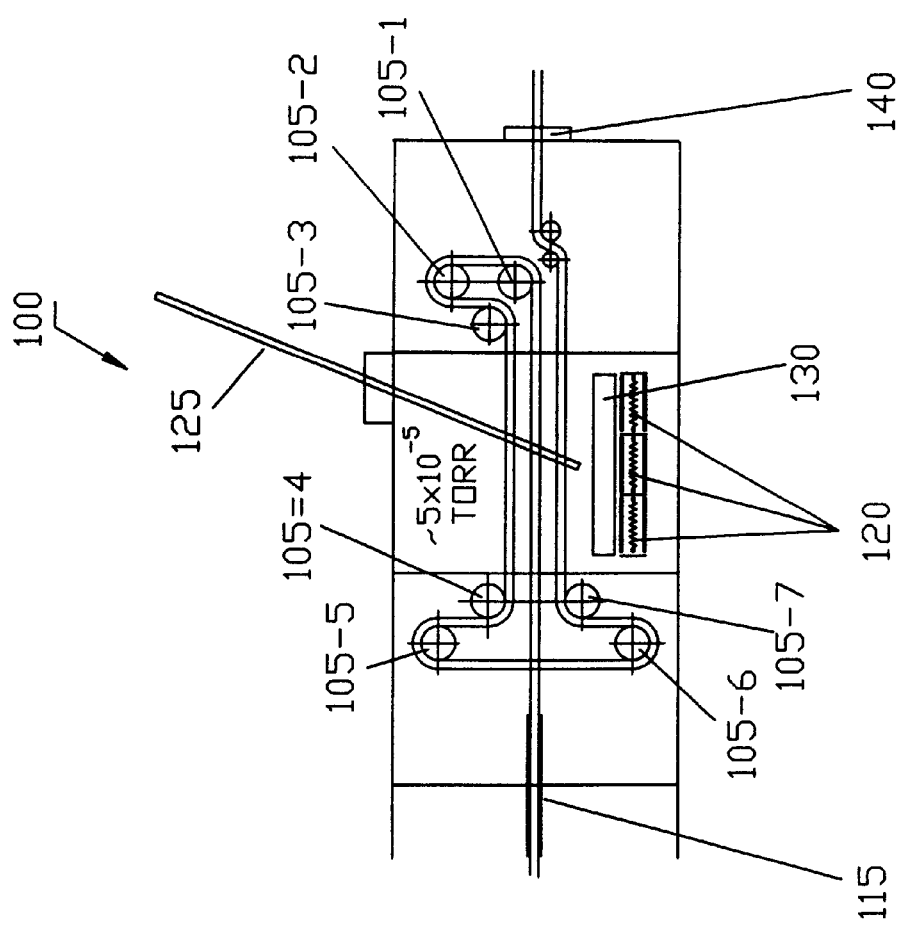
FIG. 2 is a diagram for showing an electron beam physical vapor deposition (PVD) vacuum chamber of this invention to form seamless shielding layer over the cable.

Referring to FIG. 2 for an apparatus 100, i.e., an continuous cable feeding physical vapor deposition (PVD) chamber 100 of the present invention. An automatic physical vapor deposition is performed in the chamber 100 to form a seamless shielding layer over the surface of a cable by the use of a metallic or alloy vapor. The PVD chamber 100 is maintained at a very low pressure of about $10^{-5}$ TORR and is provided with a cable driving and cooling mechanism for driving and cooling the cable 105. In a preferred embodiment, the cable driving and cooling mechanism includes a plurality of cooled wheels, e.g., cooled wheels 105-1 to 105-7 for driving the cable 110 which enters the vacuum chamber 100 through a sealed inlet 115. The chamber 100 further includes a vapor generating means which is an electron-beam vapor generating means includes an electron gun (E-gun) 120 for providing an electron beam to project to an metallic wire such as an aluminum wire 125. The aluminum wire 125 is positioned with a lower end extends to a crucible 130. Vapor of aluminum is generated with the electron beam irradiates onto the aluminum wire 125 in the crucible 130 where an elevated temperature is generated from absorbing the energy of the electron beam by the aluminum wire 125. The heated aluminum wire is evaporated and evaporated aluminum particles are deposited on the surface of the cable 110 thus forming a thin shielding layer thereon. In order to prevent the cable which includes a conductive wire wrapped by a dielectric protective layer, from being overheated or damaged by heat of metallic vapor generation, the cable 110 are cooled by the contact surface with the driving and cooling mechanism which includes the wheels 105-1 to 105-7. Each of these wheels includes a cooling tube 135. Liquid coolant are caused to flow through the cooling tube 135 for each of the driving and cooling wheels 105-1 to 105-7.

With the physical vapor deposition chamber 100 as described above provided with cable driving and cooling mechanism 105, a conductive shielding layer is deposited over the surface of a cable 110. The cable loops above the vapor generating means, e.g., an electron gun 120, serve the function to expose opposite sides of the cable 110 to the vapor generating means 120. The entire surface of the dielectric layer 158 is covered with the shielding layer 160 (referring to FIG. 3 below). Compared with the conventional foil or braided structure and traditional method of manufacture, the speed for carrying out depositing the shielding layer over the surface of the cable 110 is greatly increased because automated processes can be utilized by controlling the driving of the cable 110 through the driving and cooling system 105 and the feed of the wire 125 to the crucible 130. Additionally, the shielding layer can be formed with seamless uniform thickness. The thickness can be precisely controlled by controlling the various processing parameters in operating the PVD vacuum chamber 100.

Figure 1A:
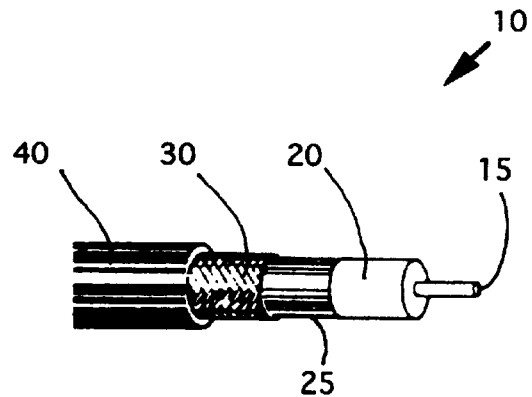
FIGS. 1A and 1B show a perspective view and a cross sectional view respectively of a conventional coaxial cable wherein foil and braid layers are employed to form the shielding layers.
Figure 1B:
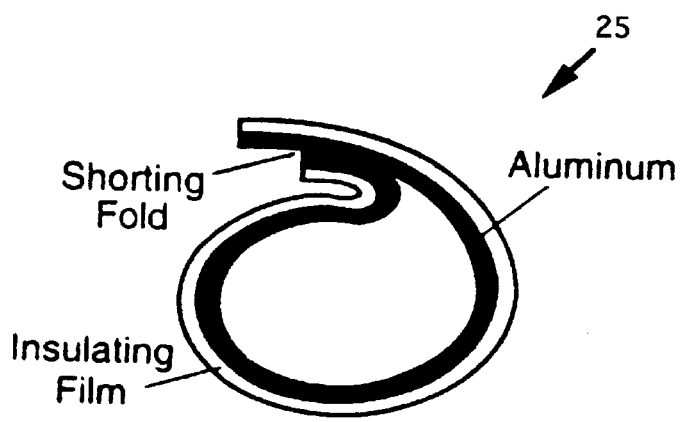
Figure 3:
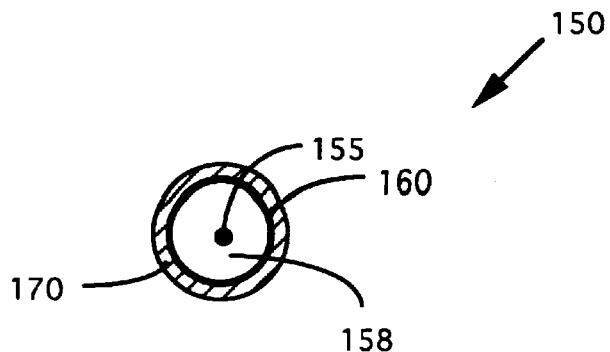
FIG. 3 a cross sectional view of an improved coaxial cable manufactured by employing a PVD vacuum chamber of FIG. 2.

FIG. 3 is a cross section view of a coaxial cable 110' produced by employing the PVD vacuum chamber to carry out the shielding layer deposition steps as disclosed in this invention. The cable 150 includes an inner conductor wire 155 wrapped around by a dielectric layer 158. This dielectric layer may be composed of materials such as polyethylene, ABS, or PC. A seamless conductive shielding layer 160 formed in the PVD vacuum chamber 100 with highly controllable thickness and high degree of structural uniformity covering the entire surface of the dielectric layer 158 is now provided. Since this shielding layer 160 is formed by vapor deposition or ion deposition (or ion assisted deposition), the thickness can be easily controlled to satisfy requirements for high frequency transmission without the concern of layer breakdown when a thin foil secured by either adhesive or braid layers as that often employed in the prior art. Instead of using a braid layer as that required in the prior art cable, an outer protective layer 170, usually composed of PVC materials, is formed directly over the shielding layer 160. The manufacture cost is greatly reduced with simplified structure. Also, since the shielding layer 160 is formed as fine evaporated particles deposited on the surface of the cable 150, unlike the foil or the braid types of shielding layer, the shielding layer 160 is securely attached to the dielectric layer 155 without a seam. The shielding layer 160 will not break off from the dielectric layer due to twisting or bending of the cable 150. A more reliable and precisely controllable structure is therefore provided to allow high frequency signal transmission to be carried out in coaxial cable when a seamless vapor deposition layer is produced by the apparatus and methods of this invention.

According to FIG. 3 and above description, this invention discloses a novel signal transmission cable 150 which includes a conductive wire 155 for signal transmission protected and wrapped inside a dielectric layer 158. The signal transmission cable further includes a seamless conductive shielding layer 160 comprising deposited physical vapor particles on an outer surface of the dielectric layer 158. In a preferred embodiment, the seamless conductive shielding layer 160 comprising deposited aluminum vapor particles on an outer surface of the dielectric layer 158. In another preferred embodiment, the seamless conductive shielding layer 160 comprising deposited copper vapor particles on an outer surface of the dielectric layer 158. In another preferred embodiment the seamless conductive shielding layer comprising deposited metallic alloy vapor particles on an outer surface of the dielectric layer. In another preferred embodiment, the dielectric layer 158 comprising a polyethylene layer. In another preferred embodiment, the electron gun 120 is replaced by a tungsten filament heating means to generate evaporating heat to produce evaporated aluminum particles for performing the vapor deposition on the cable 110.

Figure 4:
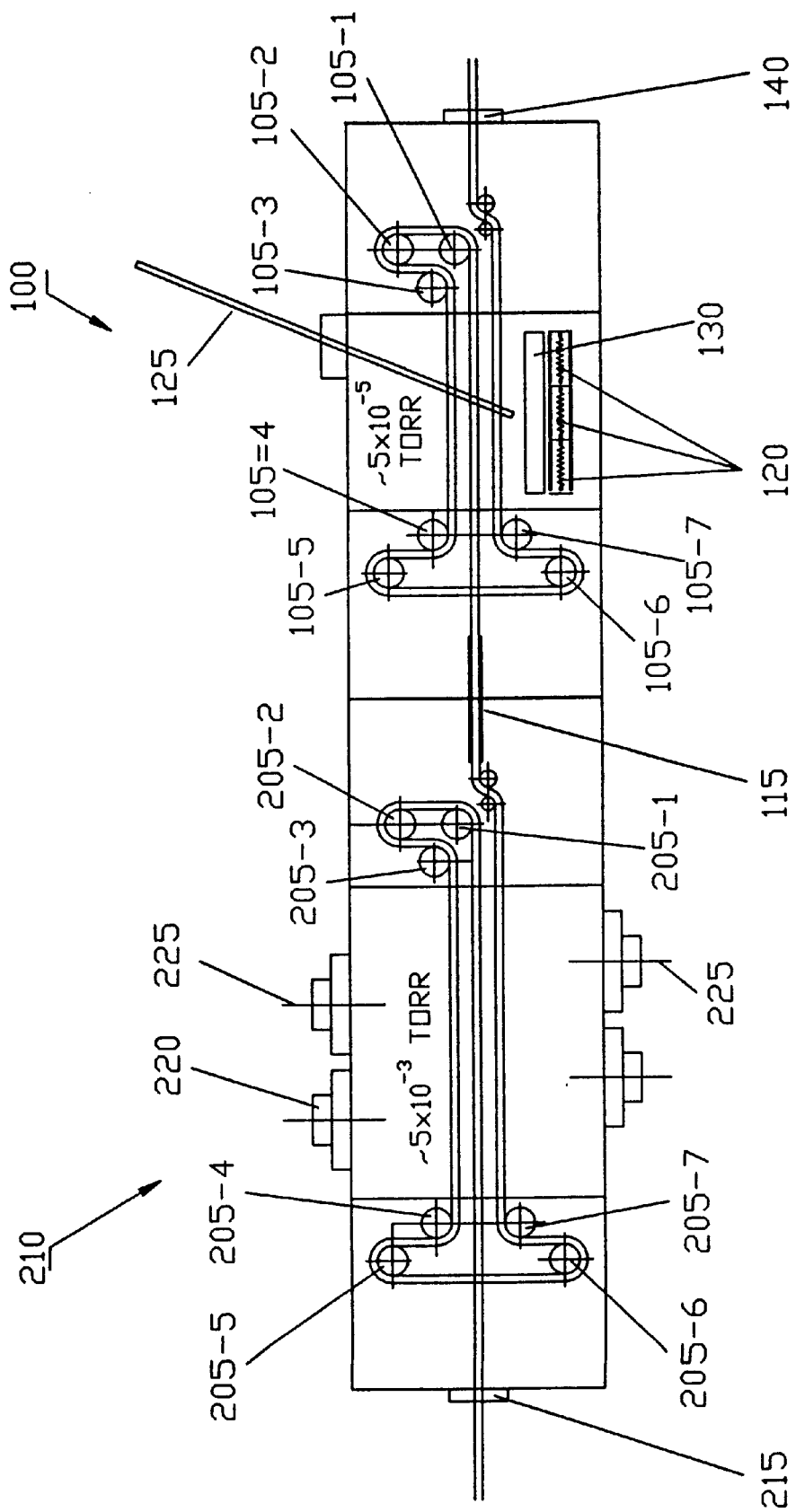
FIG. 4 is a diagram for showing an electric arc chamber and an electron beam physical vapor deposition (PVD) vacuum chamber of this invention to form seamless shielding layer over the cable.

FIG. 4 disclose another preferred embodiment of a cable shielding layer processing apparatus 200 of this invention. In addition to a first physical vapor deposition vacuum chamber 100 as that described above, the processing apparatus 200 further includes a PVD vacuum chamber 210 which also includes a plurality of cable driving and cooling wheels 205 as described above for driving and cooling the cable 110. The PVD chamber is maintained at a low pressure of about $5 \times 10^{-3}$ TORR. The PVD chamber is an arc plasma chamber where multiple cathodes 220 are provided to generate electric arc plasma. The electric arc generated by multiple cathodes are applied to induce high temperature on the target conductive wire, e.g. aluminum wires 225, or other metal or alloy wires depending on the desired shielding layer to be coated on the cable 110, to produce metallic ions. The metallic ions generated from the electric arc is then deposited on the surface of the cable. Advantage of employing an electric arc ion deposition is to produce fine metallic particles which tends to have stronger adhesion to the cable surface by the electric bias applied to the substrate. A bottom layer is thus formed through this electric arc deposition process which provides a strong base for more fine evaporated particles generated from electron beam evaporation to deposit over and thus forming a shielding layer which is highly controllable, uniformly structured having a greater layer thickness to provide effective shielding for the cable.

According to FIGS. 2 to 4 and the detail descriptions provided above, this invention discloses an apparatus for depositing a conductive shielding layer on a coaxial cable 110. The apparatus includes a cable driving and cooling mechanism 105 for guiding and driving the coaxial cable 110. The cable and driving and cooling mechanism 105 further includes a cooling means for contacting and cooling the coaxial cable 105. The apparatus further includes an electric arc vacuum chamber 210 includes an electrical arc means 220 for inducing an electric arc on a conductive source material 225 for generating a plurality of source vapor particles. The apparatus further includes an electron beam vacuum chamber 100 which includes an electron gun 120 for projecting an electron beam onto a conductive source material 125 for generating a plurality of source vapor particles. The electric arc vacuum chamber 210 and the electron beam vacuum chamber 100 further include the cable driving and cooling mechanism 105 therein for driving and guiding the coaxial cable 110 to pass therethrough for depositing the plurality of source vapor particles on the coaxial cable 110 to form the conductive shielding layer thereon. In a preferred embodiment, the cable driving and cooling means 105 comprising a plurality of cooling wheels, e.g., 105-1 to 105-7, each includes a rotating tube for driving and guiding the coaxial cable 110 thereon and for conducting a coolant through the rotating tube. In another preferred embodiment, the electric arc vacuum chamber 210 having a chamber pressure substantially in the range of $10^{-3}$ TORR to $10^{-2}$ TORR and the electron beam vacuum chamber 100 having a chamber pressure substantially in the range of $10^{-5}$ to $10^{-4}$ TORR. In another preferred embodiment, the cable driving and cooling means 105 comprising a plurality of cooling wheels provided for driving and guiding the coaxial cable 110 with a cable passage route consisting of multiple directions for increasing a passage time of the coaxial cable 110 through the electric arc vacuum chamber 210 and the electron beam vacuum chamber 100.

According to the above detail description, this invention further discloses a method for depositing a conductive shielding layer on a signal transmission cable. The method includes the steps of (a) employing a physical vapor deposition vacuum chamber for producing a plurality of conductive vapor particles therein; and (b) disposing a cable driving and cooling mechanism in the physical vapor deposition vacuum chamber for guiding and driving the signal transmission to pass therethrough and for cooling the signal transmission cable and to deposit the conductive vapor particles thereon. In a preferred embodiment, the step of disposing a cable driving and cooling mechanism in the physical vapor deposition chamber includes a step of employing a plurality of cooling wheels in the cable driving and cooling means and utilizing a rotating tube for each of the cooling wheels for driving and guiding the signal transmission cable thereon and for conducting a coolant through the rotating tube. In another preferred embodiment, the step of employing a physical vapor deposition vacuum chamber for producing a plurality of conductive vapor particles includes a step of maintaining the physical vapor deposition vacuum chamber at a chamber pressure substantially in the range of $10^{-5}$ TORR to $10^{-2}$ TORR. In another preferred embodiment, the step of disposing a cable driving and cooling mechanism in the physical vapor deposition chamber includes a step of employing a plurality of cooling wheels provided for driving and guiding the coaxial cable with a cable passage route consisting of multiple directions for increasing a passage time of the signal transmission cable through the physical vapor deposition vacuum chamber.

In summary, the present invention disclosed an apparatus for depositing a conductive shielding layer on a signal transmission cable. The apparatus includes a physical vapor deposition vacuum chamber for producing a plurality of conductive vapor particles therein. The apparatus further includes a cable driving and cooling mechanism disposed in the physical vapor deposition vacuum chamber for cooling the signal transmission cable and for guiding and driving the signal transmission cable passing therethrough to deposit the conductive vapor particles thereon. In another preferred embodiment, this invention further discloses an apparatus for depositing a conductive shielding layer on a signal transmission cable. The apparatus includes a filament vapor deposition vacuum chamber includes a filament heating element for heating a conductive source material for producing a plurality of conductive vapor particles therein. The apparatus further includes a cable driving and cooling mechanism disposed in the filament vapor deposition vacuum chamber for cooling the signal transmission cable and for guiding and driving the signal transmission cable passing therethrough to deposit the conductive vapor particles thereon.

Therefore, this invention disclosed a novel apparatus and method for forming a uniform and reliable shielding layer for the cables to provide high quality signal transmission for high frequency signals such that difficulties and limitations encountered by the prior art are resolved. Specifically, a novel physical vapor deposition (PVD) apparatus in a vacuum chamber is provided with cable driving and cooling mechanism such that a cable can be processed therein to have a thin layer of shielding layer deposited thereon by employing a physical vapor deposition process. A novel single layer seamless conductive layer to function as a shielding layer for a signal transmission cable is formed to prevent the electromagnetic interference (EMI) wherein the seamless shielding layer is highly uniform and produced with precisely controlled thickness suitable for high frequency signal transmission. In a preferred embodiment, a novel dual PVD chambers apparatus is provided, includes an electric arc chamber and an electron beam chamber, for evaporating and depositing a thin layer of evaporated metallic particles on the surface of a cable. An automated and high speed processing method is thus disclosed in this invention such that the cable can be mass produced without mechanical wrapping processes whereby the signal transmission cables can be provided at a lower production cost. Also, all the manufacture parameters can be controlled with high precision such that high quality cable can be produced in a well controlled and reliable manner whereby coaxial cables can be employed as an alternate cable for high frequency signal transmission cables without being limited to application of optical fibers.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An apparatus for depositing a conductive shielding layer on a coaxial cable comprising:

a cable driving and cooling mechanism for guiding and driving said coaxial cable;

said cable and driving and cooling mechanism further includes a cooling means for contacting and cooling said coaxial cable;

an electric arc vacuum chamber includes an electrical arc means for inducing an electric arc on a conductive source material for generating a plurality of source vapor particles;

an electron beam vacuum chamber includes an electron gun for projecting an electron beam onto a conductive source material for generating a plurality of source vapor particles; and said electric arc vacuum chamber and said electron beam vacuum chamber further include said cable driving and cooling mechanism therein for driving and guiding said coaxial cable to pass therethrough for depositing said plurality of source vapor particles on said coaxial cable to form said conductive shielding layer thereon.

2. The apparatus for forming said shielding layer of claim 1 wherein:

said cable driving and cooling means comprising a plurality of cooling wheels, each includes a rotating tube for driving and guiding said coaxial cable thereon and for conducting a coolant through said rotating tube.

3. The apparatus for forming said shielding layer of claim 1 wherein:

said electric arc vacuum chamber having a first chamber pressure controller for controlling a chamber pressure in said electric arc vacuum chamber substantially in the range of $10^{-3}$ TORR to $10^{-2}$ TORR and said electron beam vacuum chamber having a second chamber pressure controller for controlling a chamber pressure in said electron beam vacuum chamber substantially in the range of $10^{-5}$ to $10^{-4}$ TORR.

4. The apparatus for forming said shielding layer of claim 1 wherein:

said cable driving and cooling means comprising a plurality of cooling wheels provided for driving and guiding said coaxial cable with a cable passage route consisting of multiple directions for increasing a passage time of said coaxial cable through said electric arc vacuum chamber and said electron beam vacuum chamber.

5. An apparatus for depositing a conductive shielding layer on a low-melting point wrapping layer wrapping around a signal transmission cable comprising:

a physical vapor deposition vacuum chamber for producing a plurality of conductive vapor particles therein; and a cable driving and cooling means disposed in said physical vapor deposition vacuum chamber for contacting and repeatedly cooling said low-melting point wrapping layer along an entire passage as said cable driving and cooling means guiding and driving said signal transmission cable passing through said physical vapor deposition chamber to deposit said conductive vapor particles thereon.

6. The apparatus for forming said shielding layer on said low-melting point wrapping layer of claim 5 wherein:

said cable driving and cooling means comprising a plurality of cooling wheels, each includes a rotating tube to contact and repeatedly cool said low-melting point wrapping layer for driving and guiding said signal transmission cable thereon and for conducting a coolant through said rotating tube.

7. The apparatus for forming said shielding layer on said low-melting point wrapping layer of claim 5 wherein:

said physical vapor deposition vacuum chamber having a chamber pressure controller for controlling a chamber pressure in said physical vapor deposition vacuum chamber substantially in the range of $10^{-5}$ TORR to $10^{-2}$ TORR.

8. The apparatus for forming said shielding layer on said low-melting point wrapping layer of claim 5 wherein:

said cable driving and cooling means comprising a plurality of cooling wheels to contact and repeatedly cool said low-melting point wrapping layer and for driving and guiding said signal transmission cable with a cable passage route consisting of multiple directions for increasing a passage time of said signal transmission cable thorough said physical said physical vapor deposition vacuum chamber.

9. The apparatus for forming said shielding layer on said low-melting point wrapping layer of claim 5 wherein:

said physical vapor deposition vacuum chamber includes an electron beam vacuum chamber for generating said plurality of conductive vapor particles by applying an electron gum.

10. The apparatus for forming said shielding layer on said low-melting point wrapping layer of claim 5 wherein:

said physical vapor deposition vacuum chamber includes an electric arc vacuum chamber for generating said plurality of conductive vapor particles by applying an electric arc.

* * * * *